(12) United States Patent
Tan et al.

(10) Patent No.: US 6,366,081 B1
(45) Date of Patent: Apr. 2, 2002

(54) METHOD AND APPARATUS FOR HIGH THROUGHPUT MEDIA DEFECT TESTING USING TRUE REFERENCE VALUE

(75) Inventors: Seng Ghee Tan; Thomas Yun Fook Liew; Teck Ee Loh; Udaya Ahangama W. Silva, all of Singapore (SG)

(73) Assignee: Data Storage Institute, Singapore (SG)

( * ) Notice: Subject to any disclaimer, the term of this patent is extended or adjusted under 35 U.S.C. 154(b) by 0 days.

(21) Appl. No.: 09/512,439

(22) Filed: Feb. 25, 2000

(51) Int. Cl.$^7$ ............................................... G01R 33/12
(52) U.S. Cl. ........................... 324/212; 360/31; 360/39; 360/137
(58) Field of Search ............................ 324/212; 360/31, 360/39, 137

(56) References Cited

U.S. PATENT DOCUMENTS 5,280,395 A * 1/1994 Matsuzaki .................. 324/212

* cited by examiner

Primary Examiner—Walter Snow
(74) Attorney, Agent, or Firm—Cowan, Liebowitz & Latman P.C.; William H. Dippert

(57) ABSTRACT

A method and apparatus are provided for efficiently testing magnetic media in which a read level test is performed using an approximation for an average signal level in determining a test threshold and while reading data and testing against the approximate average read signal level, the data signal level is averaged to determine the real average read signal and this value is then used to adjust the results of the comparisons performed against the approximate average read level.

38 Claims, 1 Drawing Sheet

METHOD AND APPARATUS FOR HIGH THROUGHPUT MEDIA DEFECT TESTING USING TRUE REFERENCE VALUE

INTRODUCTION

The present invention relates generally to the detection of media defects during media production, which is a necessary industrial quality control step in the production process. In the magnetic media industry, media has to undergo glide, burnish and certification before being graded and eventually qualified. The present invention provides an improved testing method which potentially speeds media production.

BACKGROUND OF THE INVENTION

In media certification, there are tests for Missing Pulse, Extra Pulse, Bit Shift and Modulation. All these tests are run, based on user defined thresholds as a percentage of Track Average Amplitude (TAA). It is therefore necessary to determine Track Average Amplitude before thresholds can be set and tests conducted. Production testing apparatus typically obtain the Track Average Amplitude for a particular track using formulae. This saves time in the derivation of the Track Average Amplitude for every track but the value derived from formulae doe not reflect the true Track Average Amplitude, known as the 'true TAA' of the track. Parametric testing apparatus samples through each track and computes the average of all bytes on that track before using the computed value to compare with every byte on that track. This is 'true TAA', but the method requires a very large amount of memory for storing all of the data for the respective track, a high sampling rate to keep up with disk speed and a lengthy processing time.

A number of different ways are known for determining Track Average Amplitude, depending on the method and type of testing and preferably allow achievement of a minimum 'production time'. The following prior art specifications describe different types of testing and the corresponding manner of determining Track Average Amplitude.

U.S. Pat. No. 4,746,995 describes a sequencing operation whereby all tracks are written first and then all tracks are read back to obtain a calculated signal. This has the advantage over writing and reading on a track by track basis in that several drives can be processed simultaneously using the same electronics for one drive. It has the same processing speed as that which uses four carriages on one drive, each doing its write-read in the same sequence. However, the calculated signal is compared with a known standard which means that Track Average Amplitude is not obtained in real time and is not true for every track.

U.S. Pat. No. 5,124,849 discloses writing a series of signal pulses and reading back the pulses using two channels one of which is delayed by a multiple of the pattern's period. A comparator circuit called the CYCOMP detects amplitude deviation between the two signals; another called the Bandreject circuit detects phase deviation, both of which are indicative of aberrations and are compared with a preset error threshold. The preset error threshold is a percentage of the prevailing value of peak values of the read back signal generated by a peak following means. To collect peak values before establishing the prevailing reference value, one additional revolution for every track is required if a 'true TAA' value is used and this is at the expense of production time.

U.S. Pat. No. 5,280,395 describes a method and an apparatus whereby the mean average value computed based on an average level value for a plurality of tracks prior to the processing track is used as a reference value for comparison with subsequent read back values to detect defects. The process includes a read/write means to write and read back test signals; parametric measurement means for measuring an average-level value for each track based on read back signals: memory means for storing the average-level value for a plurality of tracks prior to the processing track. Arithmetic means for computing an average average-level value based on the average-level values for the plurality of tracks: defect detection means for detecting defects based on the average average-level value compared against read back signal of the processing track. This method gives a more reliable Track Average Amplitude in the form of average average-level value but at the expense of huge processing time. Processing time includes the time to compute average level value for every track prior to the processing track; store the values in memory; compute the average average-value and compare with the read back signal of the processing track.

U.S. Pat. No. 5,532,586 describes an Extra Pulse testing method. An erasing means erases all information on the disk in one revolution. A testing means tests every track for defects. A writing means writes data on the first track before erasure. A reading means read data from the first track before erasure. A data making means calculate from read back signal the reference value to be used for defects detection for the first track. In short there is the initializing process to generate reference data; erasing process to erase all information on disk in one revolution and testing process to test every track for defects. The advantage is that only one revolution is required to erase all information on disk. Again there is no provision for using 'true TAA' for every processing track.

U.S. Pat. No. 4,929,894 describes a method for performing Missing Pulse and Extra Pulse tests simultaneously. This method is intended to enhance throughput for disk drive quality control testing. This method involves a delay means to receive a periodic input signal and to delay that signal for a period equal to one period of the input signal. A difference means determines the difference in amplitudes between the delayed and undelayed input signal. A comparator means compares the difference in amplitudes with a reference signal and generates an error signal should there be difference in amplitudes exceeding the reference threshold. The Missing pulse test is performed at the same time as the undelayed signal is read back and testing time is thus shortened.

To summarise the prior art, the following methods for determining the Track Average Amplitude are described. The method of U.S. Pat. No. 4,746,995 uses a known standard and compares read back signal of every track with the known value. The method of U.S. Pat. No. 5,532,586 performs an initializing process for one track and computes the Track Average Amplitude for that track. That same Track Average Amplitude will be adjusted accordingly for subsequent tracks on the basis of a known relationship defining approximate changes in Track Average Amplitude changes with track number. The method of U.S. Pat. No. 5,280,395 describes the calculation of the average Track Average Amplitude for a plurality of tracks prior to the processing track. The method of U.S. Pat. No. 5,124,849 describes the calculation of a prevailing reference value and there is no account of how that value is computed. The above prior art does not show a method that uses 'true TAA' for every track in the testing nor does it describe a method in which errors are first detected, based on 'estimated TAA', herein called 'potential errors' following which the 'potential errors' are verified based on 'true TAA', the verified errors herein called 'true errors'.

SUMMARY OF THE INVENTION

According to a first aspect, the present invention provides a method of detecting defects in a selected track of a media element of a mass storage device including the steps of:

a) determining an estimated Track Average Amplitude which approximates the true Track Average Amplitude of a read signal from a track under test of the media element;

b) during first revolution of the media element, writing onto the track under test, a stream of data bits of a predetermined pattern;

c) during a second revolution of the media element, reading back the stream of data bits written to the track under test during the first revolution;

d) comparing the read signal amplitude of each bit of the stream of data read back from the track under test during the second revolution with the estimated Track Average Amplitude;

e) generating an error signal when the amplitude of a bit in the stream of data read back from the track under test during the second revolution falls outside a tolerance band defined relative to the estimated Track Average Amplitude;

f) storing each error signal and a sector at which the error occurs in a storage means;

g) calculating a true Track Average Amplitude from the amplitudes of the stream of data read back from the track under test during the second revolution; and h) after completion of the second revolution, examining the error signals stored for the track under test, in the storage means and discarding any stored error signals that represent a bit amplitude that did not fall outside of a tolerance band defined relative to the true Track Average Amplitude calculated from the stream of data read back from the track under test during the second revolution.

Preferably, embodiments of the invention include the further step of performing a missing pulse test during second revolution, the comparison threshold for the missing pulse test being determined from the estimated Track Average Amplitude previously obtained.

Preferably also, embodiments of the invention, include the further step of performing a bit shift test during second revolution.

The preferred embodiment also includes the further step of:

a) during third revolution. erasing the data recorded on the track under test during the second revolution; and b) during fourth revolution, reading back the track under test and comparing the read back signal with the calculated Track Average Amplitude.

In one embodiment of the invention, the step of calculating a true Track Average Amplitude from the amplitude of the bits in the stream of data read back from the track under test during the second revolution is achieved by sampling the data stream, converting each sample to a digital value representing the amplitude of the sample and processing the digital values representing the samples to calculate an average sample value for use as the true Track Average Amplitude.

In another embodiment of the invention, the step of calculating a true Track Average Amplitude from the amplitude of the bits in the stream of data read back from the track under test during the second revolution is achieved by a hardware device to which the read back data is fed the device being arranged to perform an averaging function on the amplitude of the bits of the read back data to produce a signal for use as the true Track Average Amplitude.

Preferably also, the preferred embodiments of the invention relate to production magnetic disks in which a complete revolution of the disk is indicated by index signals which are produced as index marks pass under index mark detectors.

In one embodiment of the invention, the estimated Track Average Amplitude is calculated by an Initialization Process in which data is written onto one track and read back from the same one track to calculate the estimated Track Average Amplitude for all tracks on the disk.

In another embodiment of the invention, the estimated Track Average Amplitude is calculated by a Known Value Process in which an estimated Track Average Amplitude is read from a set of data representing a typical relationship of Track Average Amplitude against tracks.

According to a second aspect, the present invention provides an apparatus for detecting modulation errors on a media element of a mass storage device, the mass storage device having an input/output means which provides access to a head read signal carrying information read from the media element and access to a head write signal allowing input of information to be written onto the media element the apparatus including:

a) envelope detection means to detect the envelope of the head read signal;

b) averaging means to obtain an average of the amplitude of the envelope of the head signals collected over a period of one disk revolution;

(c) an analog to digital converter arranged to periodically sample and digitise local values in the amplitude of the envelope of the head read signal, the analog to digital converter having a conversion status output to signal when conversion of a sample has been completed;

(d) a predictive comparator to compare the amplitude of the local values in the envelope of the head read signal with predetermined thresholds determined from a predicted track average amplitude;

(e) a track error buffer to store a particular digitized sample of the envelope signal when the predictive comparator indicates an out of range value for the particular sample and the conversion status signal indicates that a conversion has been completed;

f) a Sector buffer to store a sector number of each sample saved in the track error buffer.

In a preferred embodiment, the apparatus includes a modulation error detection means arranged to count occurrences of N sequential bit errors and for each occurrence to indicate detection of a modulation error, where N is a user determined. predefined number.

Preferably also, the modulation error detector includes a first counter which increments for every bit error detected and a second counter which increments when the count on the first counter exceeds N to signifying a modulation error, the first counter being reset after every N bits of head signal comparison.

In the preferred embodiment of the invention, Extra Pulse testing is combined with Missing Pulse, Modulation and Bit Shift testings so that all testings for one track are completed in four revolutions (the minimum required for conventional Extra Pulse testing).

The preferred embodiment uses the concept of first detecting errors based on 'estimated TAA' and storing the errors as 'potential errors' and at the later stage comparing said 'potential errors' with 'true TAA'.

Thus, embodiments of the present invention have the advantage of both being able to use 'true TAA' and to run tests at no extra expense of production time. This is achieved by running Extra Pulse testing concurrently with all the other tests. In addition, within the time required for Extra Pulse testing, which is four disk revolutions, 'true TAA' can be determined during the second revolution and used for Modulation, Missing Pulse and Extra Pulse testing during the third and fourth revolution, respectively.

BRIEF DESCRIPTION OF THE DRAWINGS

Embodiments of the invention will now be described by way of example, with reference to the accompanying FIG. 1, which illustrates a generalised block diagram of a Media testing system according to an embodiment of the present invention.

DETAILED DESCRIPTION OF THE PREFERRED EMBODIMENTS

Figure 1:
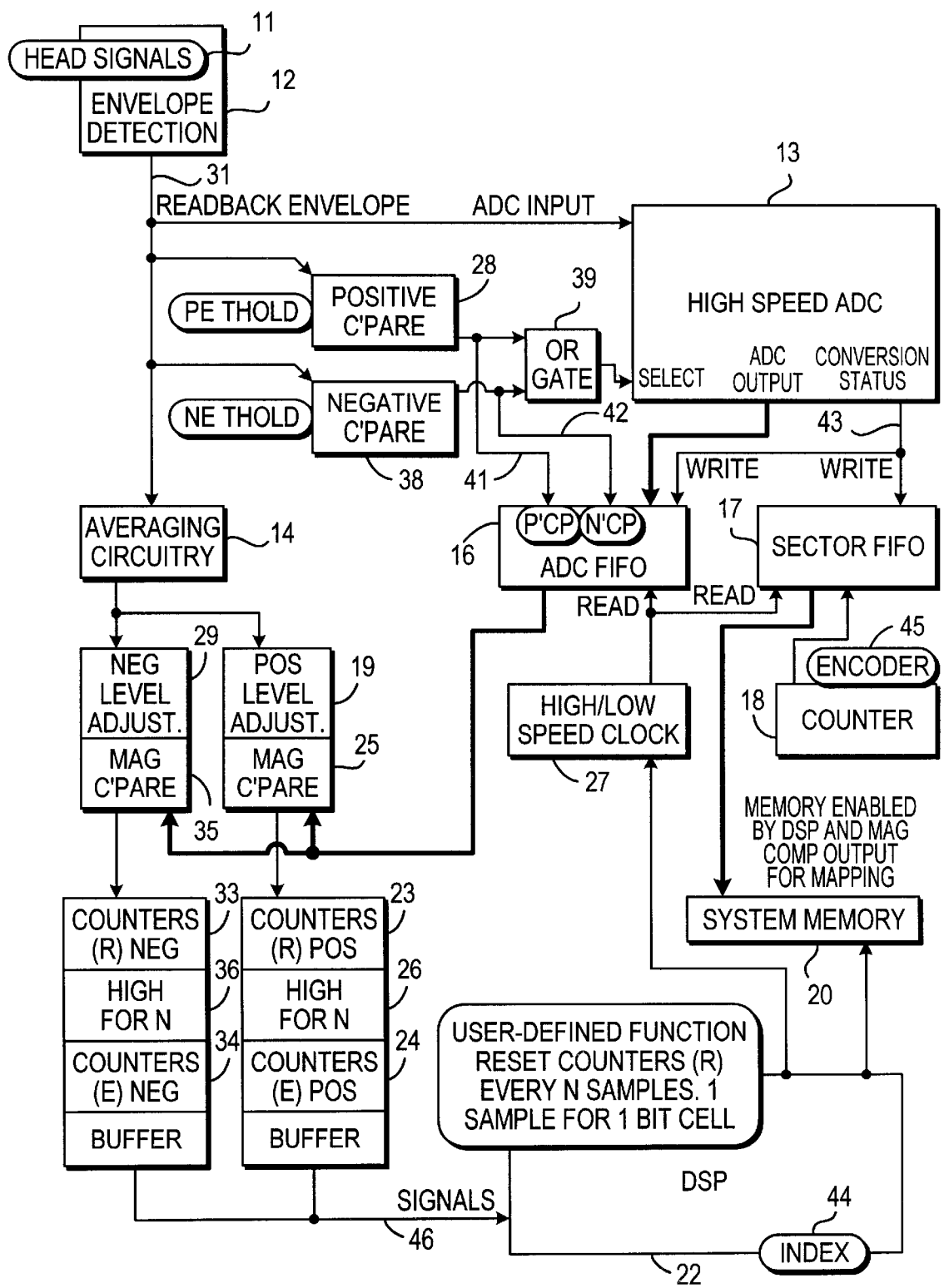

Referring to the accompanying drawing FIG. 1. an electronic detection scheme is illustrated which is used to perform modulation error testing as described above.

In the following description of the apparatus illustrated in FIG. 1 and the method of operation of this apparatus the following meanings will be given to the terms used in the description and drawings:

1. HeadSignals (11) means the read back signals from the read write head;
2. EnvelopeDetection (12) means the envelope detection circuitry used to demodulate read back head signals and to isolate the low frequency component;
3. AveragingCircuit (14) means the averaging circuitry used to compute the average or root mean square values of the head signal;
4. PositiveComparator (28) refers to the comparator circuitry for signal level comparison with respect to the positive signal threshold level;
5. NegativeComparator (38) refers to the comparator circuitry for signal level comparison with respect to the negative signal threshold level;
6. 'pe threshold' means positive threshold;
7. 'ne threshold' means negative threshold;
8. Comparators (28), (38) refers to either PositiveComparator or NegativeComparator as would be denoted by their respective numbering of 28 and 38;
9. HighSpeedAdc (13) means a high sampling rate analog-to-digital converter;
10. OR gate (39) refers to an electronic gate with logical "or" function;
11. AdcFIFO (16) is a first-in-first-out memory system;
12. SectorFIFO (17) is a first-in-first-out memory system;
13. DSP (22) means digital signal processor;
14. CountersE (24), (34) are counters that count modulation errors;
15. CountersR (23), (33) are counters that count nbit errors;
16. SystemMemory (20) is a system memory used to record bad sectors:
17. LowSpeedClock (27) is a low speed clock;
18. HighSpeedClock (27) is a high speed clock;
19. LevelAdjusters (19), (29) are voltage level generators;
20. MagCompare (25). (35) are voltage signal magnitude comparators; and
21. HighForN (26. (36) are circuits that will send a high signal level output on consecutive occurrence of N high signal levels at their respective inputs.

During a first revolution of the disk under test for the current track, a test pattern is written to the current track to provide data for tests performed during subsequent revolutions. HeadSignals 11 from a read write head of a disk drive under test are then fed into an EnvelopeDetection circuit 12 at the beginning of a second revolution of the drive under test (referred to as the 'read' revolution). The EnvelopeDetection circuit 12 rectifies the head signals 11 and filters out the high frequency components to extract the envelope signal 31 of the head signal 12. The envelope signal 31 is fed to a high speed analog to digital converter (Adc) 13, an AveragingCircuitry 14 and the PositiveComparator 28 and NegativeComparator 38. The threshold of the PositiveComparator 28 is denoted by 'pe thold' and the threshold of the NegativeComparator 38 is denoted by 'ne thold', and these correspond respectively to the 'estimated positive threshold' and the 'estimated negative threshold'. Typically an 'estimated positive threshold' is 110% of 'estimated TAA'. and an 'estimated negative threshold' is 90% of 'estimated TAA', and these thresholds are computed based on formulae.

The 'estimated positive threshold' pe-thold for the PositiveComparator 28 is deliberately lowered to anticipate more errors than the actual number of errors and these errors are called 'positive potential errors'. The 'estimated negative threshold' for the NegativeComparator 38 is deliberately increased to also anticipate more errors than the actual number of errors and these are called 'negative potential errors'. Both estimated thresholds are user-definable. In the preferred system, users can choose their own levels which are then set through the controlling software. The output of the Comparators 28, 38 trigger the HighSpeedAdc 13 via an OR gate 39 and thus enable sampling only when errors are detected. It is important to minimize the amount of data that is collected as otherwise storage requirements would be large and processing time would also increase unacceptably. The envelope is sampled and the sample values are kept in the AdcFIFO 16 buffer. The Comparators 28, 38 also output to the AdcFIFO 16, with the positive and the negative error indicators each taking up one bit of each data item of the AdcFIFO 16. If a 'positive error' is detected, the PositiveComparator 28 outputs a '1' as a positive error signal 41 to one bit of the current input data item of the AdcFIFO 16 while if a 'negative error' is detected, the NegativeComparator 38 outputs a '1' as a negative error signal 42 to one bit of the current input data item of the AdcFIFO 16. Thus the AdcFIFO 16 reads in the output of the HighSpeedAdc 13 and the Comparators 28, 38 mark the HighSpeedAdc 13 output as either a positive or negative error. The combined data item of the HighSpeedAdc 13 output. 'positive error' bit 41 and 'negative error' bit 42 are clocked into AdcFIFO 16 by the 'conversion status' signal 43 issuing from the HighSpeedAdc 13. At the same time, Counter 18 clocked by the encoder signals 45 are read into the SectorFiFO 17 to indicate the address of the recorded error. To ensure that the output value of the Counter 18 is read by the SectorFIFO 17 at the same time as the value of the output of the HighSpeedAdc 13, is read by the AdcFIFO 16, both the AdcFIFO 16 and the SectorFIFO 17 are enabled by the same 'conversion status' signal 43 of said HighSpeedAdc 13.

At the end of one revolution, signalled by a 'track end' signal 44, a control processor DSP 22 stops all acquisition. If the user selects 'mapping mode' the contents of a SectorFIFO 17 buffer will be read into a SystemMemory 20 which in this case can be external DRAM or computer memory. The SystemMemory 20 is, however, also enabled by signals 46 from positive and negative N-bit error counters Counters(E) 24, 34. The N-bit error counters Counters(E) 24, 34 are incremented by one after a series of N increments on a respective error bit counter Counters(R) 23, 33. The counts in N-bit error counters 24, 34 indicate the number of sequential N bit errors detected by the error bit counters 23, 33. If N sequential bit errors were detected, a modulation error is considered to have occurred. The number N is user-definable through the control processor DSP 22. The N-bit error counters 24, 34 increment and enable System-Memory 20 at the same time to read the SectorFIFO 17 buffer. The SectorFIFO 17 buffer content is then read into SystemMemory 20 to indicate the sector number in which the modulation error occurred. The length of time required for processing is not a concern in the 'mapping mode'. The control processor DSP 22 triggers a LowSpeedClock 27 to enable reading of the SectorFIFO 17 buffer as the System-Memory 20 has a slow access time. Turning back to the 'production mode', the control processor DSP 22 triggers a HighSpeedClock 27 to enable reading of the AdcFIFO 16 buffer. All of contents of the AdcFIFO 16 buffer, which are 'potential errors', are read off to compare with the 'true TAA'. Note that the 'true TAA' value will be immediately available at the end of the 'read' (second) revolution, either as a result of a relatively low sampling rate and hence low processing time or as a result of hardware used to process Track Average Amplitude. Since there will typically be a limited number of errors, the AdcFIFO 16 buffer will be emptied quickly, relative to the other processing steps and this step will be completed prior to the completion of one further revolution of the disk.

For illustration, take for example an embodiment in which the processing time for one byte is 50 ns. The point at which the test should be abandoned is when the AdcFIFO 16 buffer contains more than 64 Kbytes of errors, but emptying 64 Kbytes of data will require only a little more than 3 ms which is far less than the time required for the 'erase' (third) revolution. If the AdcFIFO 16 buffer is full in less than a full revolution, a 'status full' signal from the AdcFIFO 16 buffer prompts the control processor DSP 22 to automatically go to the mapping mode and display a failure message. The 'read' (second) revolution is then repeated to acquire data for mapping. Level Adjusters 19, 29 are user programmable through software, and control the thresholds for comparison (i.e. to adjust the level of 'positive thresholds' and 'negative thresholds'). A pair of comparators MagCompare 25, 35 compare 'potential errors' with 'true TAA'. The comparators 25, 35 output a '1' if a 'potential error' is found to fail on modified thresholds based on the 'true TAA' and the respective comparator clocks one of the bit error counters 33, 23. The value of N defining the length of N bit cells is pre-defined through the control processor (DSP) 22, and the error counters 23, 33 will be reset after every N clockings. An error rate monitoring circuit HighForN 26, 36 detects occurrences of N increments of the error bit counters, CountersR 23 and CountersR 33 in N bits of read data and clocks one of the N-bit error counters. CountersE 24 and CountersE 34 when this happens. The error bit counters. CountersR 23 and CountersR 33 will never attain the value of N if there are less than N errors in every reset cycle and the N-bit error counters, CountersE 24 and CountersE 34 will in that case never record a modulation error. This, as explained earlier, determines that a modulation error is detected only if there are N consecutive error bits detected where N is user-definable.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

What is claimed is:

1. A method of detecting defects in a selected track of a media element of a mass storage device including the steps of;
   a) determining an estimated Track Average Amplitude which approximates the true Track Average Amplitude of a read signal from a track under test of the media element;
   b) during first revolution of the media element, writing onto the track under test, a stream of data bits of a predetermined pattern;
   c) during a second revolution of the media element, reading back the stream of data bits written to the track under test during the first revolution;
   d) comparing the read signal amplitude of each bit of the stream of data read back from the track under test during the second revolution with the estimated Track Average Amplitude;
   e) generating an error signal when the amplitude of a bit in the stream of data read back from the track under test during the second revolution falls outside a tolerance band defined relative to the estimated Track Average Amplitude;
   f) storing each error signal and a sector at which the error occurs in a storage means;
   g) calculating a true Track Average Amplitude from the amplitude of the stream of data read back from the track under test during the second revolution; and
   h) after completion of the second revolution, examining the error signals stored for the track under test, in the storage means and discarding any stored error signals that represent a bit amplitude that did not fall outside of a tolerance band defined relative to the true Track Average Amplitude calculated from the stream of data read back from the track under test during the second revolution.

2. The method of claim 1, including the further step of performing a missing pulse test during second revolution, the comparison threshold for the missing pulse test being determined from the estimated Track Average Amplitude previously obtained.

3. The method of claim 2, including the further step of performing a bit shift test during second revolution.

4. The method of claim 2, including the further step of
   a) during third revolution, erasing the data recorded on the track under test during the second revolution; and
   b) during fourth revolution, reading back the track under test and comparing the read back signal with the calculated Track Average Amplitude.

5. The method of claim 2, wherein the steps of calculating a true Track Average Amplitude from the amplitude of the bits in the stream of data read back from the track under test during the second revolution is achieved by sampling the data stream, converting each sample to a digital value representing the amplitude of the sample and processing the digital values representing the samples to calculate an average sample value for use as the true Track Average Amplitude.

6. The method of claim 2, wherein the step of calculating a true Track Average Amplitude from the amplitude of the bits in the stream of data read back from the track under test during the second revolution is achieved by a hardware device to which the read back data is fed the device being arranged to perform an averaging function on the amplitudes of the bits of the read back data to produce a signal for use as the true Track Average Amplitude.

7. The method of claim 2, wherein the media element is a magnetic disk and a complete revolution of the disk is indicated by index signals which are produced as index marks pass under index mark detectors.

8. The method of claim 2, wherein the estimated Track Average Amplitude is calculated by an Initialization Process in which data is written onto one track and read back from the same one track to calculate the estimate track Average Amplitude for all tracks on the disk.

9. The method of claim 2, wherein the estimated Track Average Amplitude is calculated by a Known Value Process in which an estimated Track Average Amplitude is read from a set of data representing a typical relationship of Track Average Amplitude against tracks.

10. The method of claim 1, including the further step of performing a bit shift test during second revolution.

11. The method of claim 10, including the further step of
a) during third revolution, erasing the data recorded on the track under test during the second revolution; and
b) during fourth revolution, reading back the track under test and comparing the read back signal with the calculated Track Average Amplitude.

12. The method of claim 10, wherein the steps of calculating a true Track Average Amplitude from the amplitude of the bits in the stream of data read back from the track under test during the second revolution is achieved by sampling the data stream, converting each sample to a digital value representing the amplitude of the sample and processing the digital values representing the samples to calculate an average sample value for use as the true Track Average Amplitude.

13. The method of claim 10, wherein the step of calculating a true Track Average Amplitude from the amplitude of the bits in the stream of data read back from the track under test during the second revolution is achieved by a hardware device to which the read back data is fed the device being arranged to perform an averaging function on the amplitudes of the bits of the read back data to produce a signal for use as the true Track Average Amplitude.

14. The method of claim 10, wherein the media element is a magnetic disk and a complete revolution of the disk is indicated by index signals which are produced as index marks pass under index mark detectors.

15. The method of claim 10, wherein the estimated Track Average Amplitude is calculated by an Initialization Process in which data is written onto one track and read back from the same one track to calculate the estimate track Average Amplitude for all tracks on the disk.

16. The method of claim 10, wherein the estimated Track Average Amplitude is calculated by a Known Value Process in which an estimated Track Average Amplitude is read from a set of data representing a typical relationship of Track Average Amplitude against tracks.

17. The method of claim 1, including the further step of
a) during third revolution, erasing the data recorded on the track under test during the second revolution; and
b) during fourth revolution, reading back the track under test and comparing the read back signal with the calculated Track Average Amplitude.

18. The method of claim 17, wherein the steps of calculating a true Track Average Amplitude from the amplitude of the bits in the stream of data read back from the track under test during the second revolution is achieved by sampling the data stream, converting each sample to a digital value representing the amplitude of the sample and processing the digital values representing the samples to calculate an average sample value for use as the true Track Average Amplitude.

19. The method of claim 17, wherein the step of calculating a true Track Average Amplitude from the amplitude of the bits in the stream of data read back from the track under test during the second revolution is achieved by a hardware device to which the read back data is fed the device being arranged to perform an averaging function on the amplitudes of the bits of the read back data to produce a signal for use as the true Track Average Amplitude.

20. The method of claim 17, wherein the media element is a magnetic disk and a complete revolution of the disk is indicated by index signals which are produced as index marks pass under index mark detectors.

21. The method of claim 17, wherein the estimated Track Average Amplitude is calculated by an Initialization Process in which data is written onto one track and read back from the same one track to calculate the estimate track Average Amplitude for all tracks on the disk.

22. The method of claim 17, wherein the estimated Track Average Amplitude is calculated by a Known Value Process in which an estimated Track Average Amplitude is read from a set of data representing a typical relationship of Track Average Amplitude against tracks.

23. The method of claim 1, wherein the steps of calculating a true Track Average Amplitude from the amplitude of the bits in the stream of data read back from the track under test during the second revolution is achieved by sampling the data stream, converting each sample to a digital value representing the amplitude of the sample and processing the digital values representing the samples to calculate an average sample value for use as the true Track Average Amplitude.

24. The method of claim 23, wherein the media element is a magnetic disk and a complete revolution of the disk is indicated by index signals which are produced as index marks pass under index mark detectors.

25. The method of claim 23, wherein the estimated Track Average Amplitude is calculated by an Initialization Process in which data is written onto one track and read back from the same one track to calculate the estimate track Average Amplitude for all tracks on the disk.

26. The method of claim 23, wherein the estimated Track Average Amplitude is calculated by a Known Value Process in which an estimated Track Average Amplitude is read from a set of data representing a typical relationship of Track Average Amplitude against tracks.

27. The method of claim 1, wherein the step of calculating a true Track Average Amplitude from the amplitude of the bits in the stream of data read back from the track under test during the second revolution is achieved by a hardware device to which the read back data is fed the device being arranged to perform an averaging function on the amplitudes of the bits of the read back data to produce a signal for use as the true Track Average Amplitude.

28. The method of claim 27, wherein the media element is a magnetic disk and a complete revolution of the disk is indicated by index signals which are produced as index marks pass under index mark detectors.

29. The method of claim 27, wherein the estimated Track Average Amplitude is calculated by an Initialization Process in which data is written onto one track and read back from the same one track to calculate the estimate track Average Amplitude for all tracks on the disk.

30. The method of claim 27, wherein the estimated Track Average Amplitude is calculated by a Known Value Process in which an estimated Track Average Amplitude is read from a set of data representing a typical relationship of Track Average Amplitude against tracks.

31. The method of claim 1, wherein the media element is a magnetic disk and a complete revolution of the disk is indicated by index signals which are produced as index marks pass under index mark detectors.

32. The method of claim 31, wherein the estimated Track Average Amplitude is calculated by an Initialization Process in which data is written onto one track and read back from the same one track to calculate the estimate track Average Amplitude for all tracks on the disk.

33. The method of claim 31, wherein the estimated Track Average Amplitude is calculated by a Known Value Process in which an estimated Track Average Amplitude is read from a set of data representing a typical relationship of Track Average Amplitude against tracks.

34. The method of claim 1, wherein the estimated Track Average Amplitude is calculated by an Initialization Process in which data is written onto one track and read back from the same one track to calculate the estimate track Average Amplitude for all tracks on the disk.

35. The method of claim 34, wherein the estimated Track Average Amplitude is calculated by a Known Value Process in which an estimated Track Average Amplitude is read from a set of data representing a typical relationship of Track Average Amplitude against tracks.

36. The method of claim 1, wherein the estimated Track Average Amplitude is calculated by a Known Value Process in which an estimated Track Average Amplitude is read from a set of data representing a typical relationship of Track Average Amplitude against tracks.

37. An apparatus for detecting modulation errors on a media element of a mass storage device, the mass storage device having an input/output means which provides access to a head read signal carrying information read from the media element and access to a head write signal allowing input of information to be written onto the media element, the apparatus including:

a) envelope detection means to detect the envelope of the head read signal;

b) averaging means to obtain an average of the amplitude of the envelope of the head signals collected over a period of one disk revolution;

c) an analog to digital converter arranged to periodically sample and digitize local values in the amplitude of the envelope of the head read signal, the analog to digital converter having a conversion status output to signal when conversion of a sample has been completed;

d) a predictive comparator to compare the amplitude of the local values in the envelope of the head read signal with predetermined thresholds determined from a predicted track average amplitude;

e) a track error buffer to store a particular digitized sample of the envelope signal when the predictive comparator indicates an out of range value for the particular sample and the conversion status signal indicates that a conversion has been completed;

f) a Sector buffer to store a sector number of each sample saved in the track error buffer; and g) a modulation error detection means arranged to count occurrences of N sequential bit errors and for each occurrence to indicate detection of a modulation error, where N is a user determined, predefined number.

38. The apparatus of claim 37, wherein the modulation error detector includes a first counter which increments for every bit error detected and a second counter which increments when the count on the first counter exceeds N to signify a modulation error, the first counter being reset after every N bits of head signal comparison.

* * * * *